United States Patent [19]

Hong

[11] Patent Number: 5,495,441
[45] Date of Patent: Feb. 27, 1996

[54] SPLIT-GATE FLASH MEMORY CELL

[75] Inventor: Gary Hong, Hsin-Chu, Taiwan

[73] Assignee: United Microelectronics Corporation, Hsin-Chu, Taiwan

[21] Appl. No.: 245,505

[22] Filed: May 18, 1994

[51] Int. Cl.[6] .................................................. G11C 13/00
[52] U.S. Cl. .................... 365/185.01; 357/316; 357/320; 437/52
[58] Field of Search ................................. 365/185, 900; 257/317, 316, 319, 320; 437/52

[56] References Cited

U.S. PATENT DOCUMENTS

| | | | |
|---|---|---|---|
| 4,970,689 | 11/1990 | Kenney | 365/189.01 |
| 5,291,439 | 3/1994 | Kauffmann et al. | 365/185 |
| 5,313,421 | 5/1994 | Guterman et al. | 365/184 X |
| 5,343,063 | 8/1994 | Yuan et al. | 365/900 X |

*Primary Examiner*—Do Hyun Yoo
*Attorney, Agent, or Firm*—Meltzer, Lippe, Goldstein et al.

[57] ABSTRACT

This patent discloses a split-gate flash memory cell having a vertical isolation gate and a process for making it. The inventive cell has better control and a denser memory array than conventional cells. By use of a vertical isolation gate a smaller cell size is obtained. The memory cell has a floating gate transistor formed in a substrate having a channel extending underneath a floating gate, and a vertical isolation transistor formed in the substrate having a channel parallel to a trench holding a portion of a polysilicon control gate and orthogonal to the channel of the floating gate transistor.

19 Claims, 3 Drawing Sheets

SPLIT-GATE FLASH MEMORY CELL

FIELD OF THE INVENTION

The present invention relates to the fabrication of a vertical split-gate Flash memory cell, specifically, a Flash memory cell which can offer better process control and denser memory array.

BACKGROUND OF THE INVENTION

A conventional split-gate flash memory cell is shown in FIG. 1. Two N$^+$ bit lines 11, 12 are formed as a source 11 and a drain 12 in a p-type silicon substrate 13. A floating gate 14 is formed over part 18b of the channel 18. A drain capacitance is formed between the drain and the floating gate. A control gate 15 is formed over the remainder 18a of the channel 18 and over the floating gate 14. The control gate is separated from the floating gate by an insulating layer or a dielectric 19. A control capacitance is formed between the floating gate and the control gate. The two capacitances form the coupling for driving each cell. The inversion region directly under the control gate is established directly by a "write or read access" voltage applied to the control gate. The inversion region in the channel under the floating gate is indirectly established through the capacitances by the control gate voltage and by another write access voltage applied to the drain. The cell is erased by ultraviolet illumination or by electrons from the floating gate tunneling through a thin oxide 10.

L1 designates the channel length of an isolation transistor and L2 designates the channel length of a floating gate transistor. The floating gate transistor has a source 11, drain 12 and gate 14 and the isolation transistor has a source 11, drain 12 and gate 15. The total channel length is L1+L2 which is defined by a mask. The length L2 of the channel which is beneath the floating gate 14 varies with mask alignment tolerances. Such memory cells are discussed, for example, in U.S. Pat. Nos. 4,868,629 to Eitan and 4,328,565 to Harari, both of which are hereby incorporated by reference.

Flash memories are high-density non-volatile semiconductor memories which offer fast access times. The cell is programmed when charge is stored in the floating gate and unprogrammed when the floating gate is discharged. Generally, the charge is transferred into and out of the floating gate through a thin oxide region. Conventional split-gate transistor cells of the type shown in FIG. 1 do not lend themselves to being reduced in substrate area.

Single transistor flash memory cells are programmed by the application of a positive potential to their drain region and a programming potential to their control gate. This causes the electrons to be transferred onto the floating gate. The cells are erased by a positive potential application to the source region wherein the control gate is grounded and the drain region is left floating. This causes the electrons on the floating gate to tunnel through the gate oxide into the channel and source region. However, single transistor flash memory cell is known to suffer from over-erase problem.

For a flash memory cell, the split-gate structure, as shown in FIG. 1, is known to be able to overcome the over-erase problem but at the expense of a larger cell size. Several publications and patents have been concerned with the fabrication of split-gate structure. For example, U.S. Pat. No. 4,868,629 discloses a structure wherein a photo-resist pattern is used to cover part of the floating gate area and the channel region of the isolation transistor during the process of source/drain N$^+$ implantation. The isolation transistor is in series with the floating gate transistor. The portion of the transistor channel length under the floating gate will be defined by the floating gate itself. In its preferred embodiment, the drain and source regions are formed by ion implantation and one edge of the floating gate defines the lateral limit of one side of the drain region. A photo-resist extends partially over the floating gate in one direction and beyond the floating gate in the other direction. The source region is defined by an opening in the photo-resist extending beyond the floating gate.

This method is problematic in at least two ways. First, the total channel length, floating gate and isolation gate, cannot easily be consistently controlled because the control is strongly dependent upon the photo-lithography alignment and CD loss. Second, the total channel length, and thus the cell size, tends to be larger due to the same photo lithography process limitation.

U.S. Pat. No. 5,115,288 to Manley, which is hereby incorporated by reference, discloses a method of fabricating an integrated circuit using a conductive spacer to define the gate length of the series select transistor in a split gate memory cell. The length of the spacer can be precisely controlled. A floating gate is formed on a layer of insulating material which covers a substrate. The sides of the floating gate are sealed with insulating material. A conductive spacer is formed adjacent one side of the floating gate and insulated from the floating gate by the seal and from the substrate by the insulating material. The spacer is utilized to defined a self-aligned source and the floating gate is used to define a self-aligned drain. The floating gate only extends over a portion of the channel. The spacer is positioned over the remaining portion of the channel, between the source and the floating gate. A conductive control gate is formed in electrical contact with the spacer. The control gate extends over and is electrically insulated from the floating gate. Therefore, a constant total channel length is produced.

However, this process requires an extra poly layer, that is a three poly process versus a two poly process. Further, one critical photo-masking step, which uses photo-resist, is required to cover half of the floating gate for one-side poly spacer removing. U.S. Pat. No. 4,317,272 to Kuo et al., which is hereby incorporated by reference, discloses an electrically erasable programmable memory cell. An erase window for the first level polysilicon floating gate is positioned beneath a third level poly erase line. Each cell includes a memory transistor (floating gate) Q1, a series enhancement transistor (isolation transistor) Q2 and an erase window C. The series enhancement transistor has a control gate which is an extension of the control gate of the memory transistor without the floating gate interposed. The drains of the Q2 transistors are formed by edges of the inverted channels of the transistors Q1 when Q1 is on. This device is problematic because of its large cell size due to the combined channel length of the two transistors.

Additionally, since two transistors are in series for a split-gate flash cell, a larger cell size than a one-transistor flash cell is inevitable when conventional methods are used to build the cell. The cell size in these conventional memory cells has been large due to the cell layout and configuration. Smaller cell size is desirable in order to provide a more dense array with more cells in a given silicon substrate area and to lower cost and increase manufacture yields.

It is an object of the present invention to provide a process for and structure of a flash memory cell which overcomes the aforementioned problems.

SUMMARY OF THE INVENTION

The present invention provides a process for and structure of a vertical split-gate flash memory cell. The inventive cell is better able to be controlled and results in a denser memory array than conventional memory cells. The inventive cell overcomes the over-erase problem without sacrificing cell size.

One embodiment of the invention provides a memory cell which comprises a floating gate transistor formed in a substrate having a channel extending underneath a floating gate, and a vertical isolation transistor formed in the substrate. The vertical transistor has a channel parallel to a trench holding a portion of a polysilicon control gate and orthogonal to the channel of the floating gate transistor.

Another embodiment of the invention provides a memory cell which comprises a substrate of a first dopant type having a trench. A first oxide layer is grown on the surface of the substrate. A trench is formed in the substrate. A source of a second dopant type is formed in the trench. A drain of a second dopant type is formed near the surface of the substrate. A floating gate is deposited on the oxide layer between the source and the drain. A second oxide layer is grown on walls of the gate and the trench. A dielectric is deposited on the floating gate. A control gate covers the oxide layer and the dielectric. The source and drain are separated by a channel length of a floating gate transistor and a channel length of a vertical isolation transistor runs parallel to a side wall of the trench.

In still another embodiment of the invention, a process for fabricating a split-gate flash memory cell is provided. This process comprises the following steps: Growing a first-oxide layer on a substrate having a first dopant type. Depositing a polysilicon layer on the first oxide layer. Forming a dielectric on the polysilicon layer. Patterning polysilicon floating gates out of the polysilicon layer and the first oxide layer using a mask and etch process. Forming trenches in the substrate between every other one of the floating gates using a mask and etch process. Growing a second oxide layer on side walls of the floating gates and the trenches. Implanting ions of a second dopant type in the trenches and between the floating gates. Depositing a word line over the second oxide layer and the dielectric.

DETAILED DESCRIPTION OF THE INVENTION

The figures, discussed above and below, illustrate only one cell of a device. A semiconductor memory is made up of a plurality of these cells.

Figure 2:
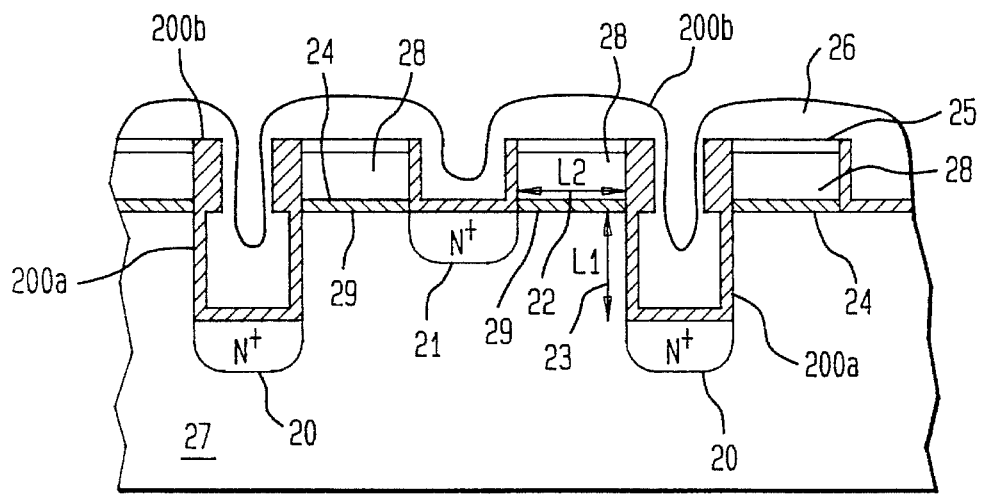
FIG. 2 illustrates the cell structure of the present invention.

The structure of the flash memory cell of the invention is illustrated in FIG. 2. The flash memory cell comprises a silicon substrate 27 of a first dopant type. Illustratively, the substrate is P-type silicon having a dopant concentration of about $1\times10^{14}/cm^3$ to about $5\times10^{15}/cm^3$. Buried bit lines of a second dopant type are formed in the substrate. The second dopant type is illustratively $N^+$. These bit lines form sources 20 and drains 21. The source bit lines 20 are located in deep trenches within the substrate whereas the bit lines for the drain 21 are located near the surface of the substrate. The trenches penetrate the substrate to a depth of approximately 0.4 μm to 1.0 μm. A tunnel oxide layer 24 is grown over the surface of the substrate 27, including the drain 21. The tunnel oxide layer has a thickness of approximately 100 Å. Polysilicon floating gates 28 are formed on the tunnel oxide layer 24 and aligned over the channels 29 between the sources and drains. An oxide layer 200 is grown on the walls of the trenches and the side walls of the polysilicon gates 28. The portion 200a of the oxide layer 200 grown on the side walls of the trenches, i.e, on the substrate, is grown at the same time as the portion of the oxide layer 200b which grows on the side walls of the polysilicon gates 28. The portion 200a of the oxide layer is a gate oxide. The oxide layer 200b grown on the side walls of the gates 28 is thicker than the gate oxide 200a in the trenches due to the higher growth rate on polysilicon than on silicon substrate. Illustratively, the oxide layer 200b is about 300 Å if the gate oxide 200a is about 200 Å. An inter-polysilicon or dielectric layer 25 is formed over the floating gates 28 to an effective thickness of approximately 200 Å. The dielectric may be oxide-nitride-oxide ("ONO"). The oxide layer 200b is part of the interpoly dielectric but it is a pure oxide, i.e., not "ONO".

Figure 1:
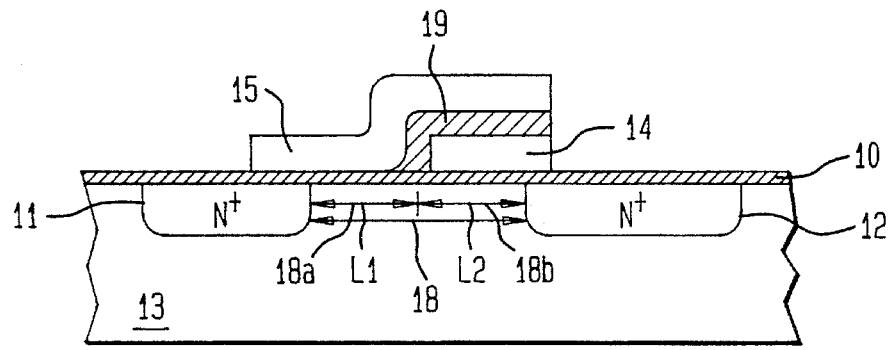
FIG. 1 illustrates a conventional split gate Flash memory cell.

A polysilicon word line or control gate 26 is formed over the entire structure to a thickness of approximately 1000 Å to 4000 Å. The floating gate transistor of the cell is indicated at 22 and has a channel length L2. The vertical isolation transistor of the cell is indicated at 23 and has a channel length L1. The floating gate transistor 22 comprises source 20, drain 21 and gate 28 with the tunnel oxide 24 acting as a gate oxide and the vertical isolation transistor 23 comprises source 20, drain 21 and gate 26 with gate oxide 200a. The horizontal channel length is L2. Therefore, the overall size of the cell will be less than in conventional cells which have a horizontal channel length of L1+L2, as shown in FIG. 1.

Figure 3:
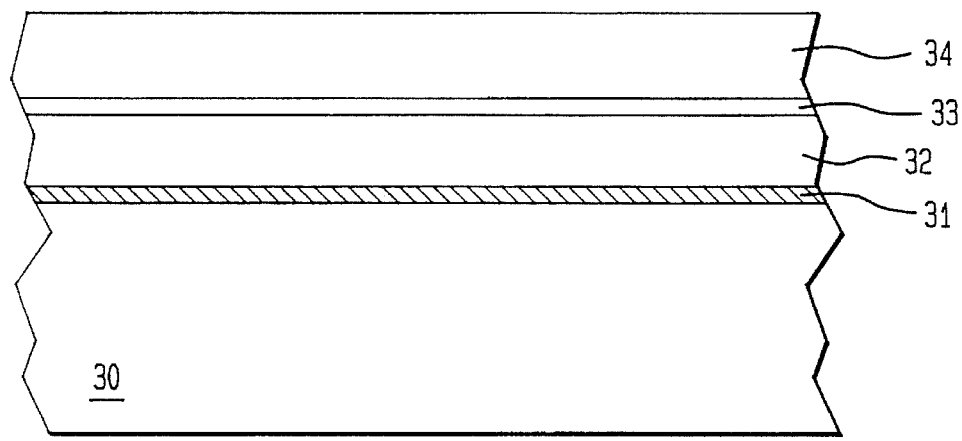
FIGS. 3, 4, 5(a), 5(b), 6, and 7 illustrate the process of the present invention.

A process for making the flash memory cells of FIG. 2 is shown in FIGS. 3 to 7. As shown in FIG. 3, the process starts with a substrate 30 of one dopant type. Illustratively, the dopant type is a p-type silicon substrate with a dopant concentration of $1\times10^{14}/cm^3$ to $5\times10^{15}/cm^3$. Next, a tunnel oxide 31 is grown over the entire surface to a thickness of approximately 100 Å. The tunnel oxide will be the gate oxide for the floating gate transistor and may be grown by thermal oxidation. A first polysilicon layer 32 is deposited on the tunnel oxide 31 to a thickness of approximately 2000 Å. The first polysilicon layer 32 is then doped. Next, an interpoly dielectric 33 is formed on the first polysilicon layer 32. The interpoly dielectric may be an oxide-nitride-oxide dielectric ("ONO") with an effective thickness of approximately 200 Å. Next, a layer of photo resist 34 is deposited on the interpoly dielectric layer 33 and patterned.

Figure 4:
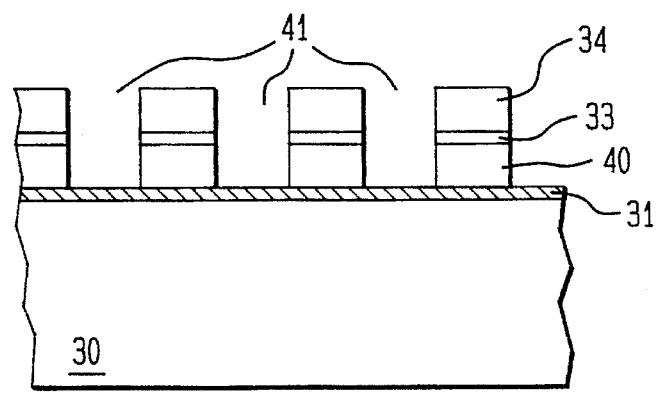

As shown in FIG. 4, the polysilicon layer 32 is patterned to form polysilicon gates 40. A conventional mask and etch process is used to form the gates. This process forms spaces 41 in the polysilicon layer 32 between the gates 40, thereby removing portions of the photo-resist layer 34, the dielectric 33 and the polysilicon layer 32.

Figure 5A:
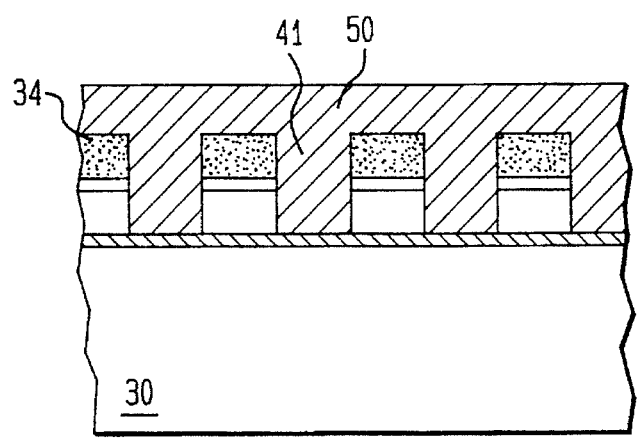
Figure 5B:
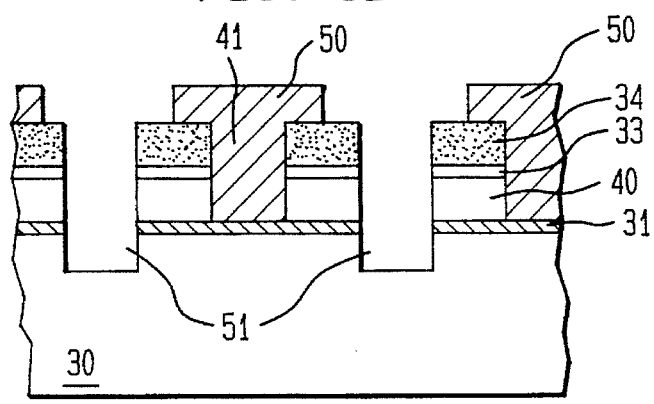

As shown in FIG. 5a, the remaining portions of the first layer of photo-resist 34 are exposed to ultra-violet ("UV") light for UV baking. A second layer of photo-resist 50 is deposited on the structure. The second photo-resist layer 50 is masked and patterned to form trenches 51 in every other space 41, as shown in FIG. 5(b). The photoresist 50 remains in the other spaces 41 between each trench 51. The trenches 51 are etched into the substrate 30 to a depth of approximately 0.6 microns forming deep trenches 51. The spaces 41 will become the drains of the cells and the trenches 51 will become the sources of the cells.

Figure 6:
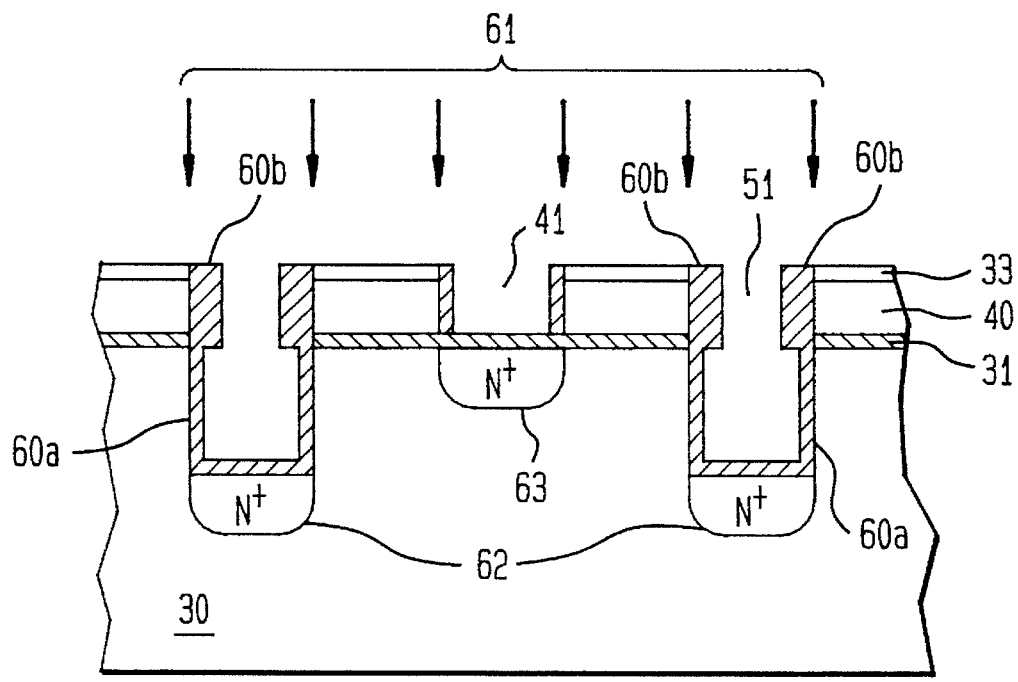

As shown in FIG. 6, the first and second layers of photo-resist 34, 50 are removed or stripped. Next, an oxide layer 60 is grown on the side walls of the trenches 51 and the side walls of the gates 40. The portion 60b of the oxide layer 60 grown on the sides of the polysilicon gates 40 is grown to a greater thickness then the portion 60a grown on the side walls of the trench 51 in the substrate 30. This difference in thickness is due to a higher growth rate on polysilicon than on the silicon substrate. The portion 60a of the oxide layer is the gate oxide for the floating gate transistor and the portion 60b of the oxide layer is part of the interpoly dielectric. The device is then subjected to ion implantation of a second dopant type, as indicated by the arrows 61, thereby, forming sources 62 in the trenches 51 and drains 63 in the spaces 41. Illustratively, the second dopant type is $N^+$ and the implantation is of Arsenic ions at an energy of about 50 Kev and a dose unit of about $5 \times 10^{15}/cm^2$.

Figure 7:
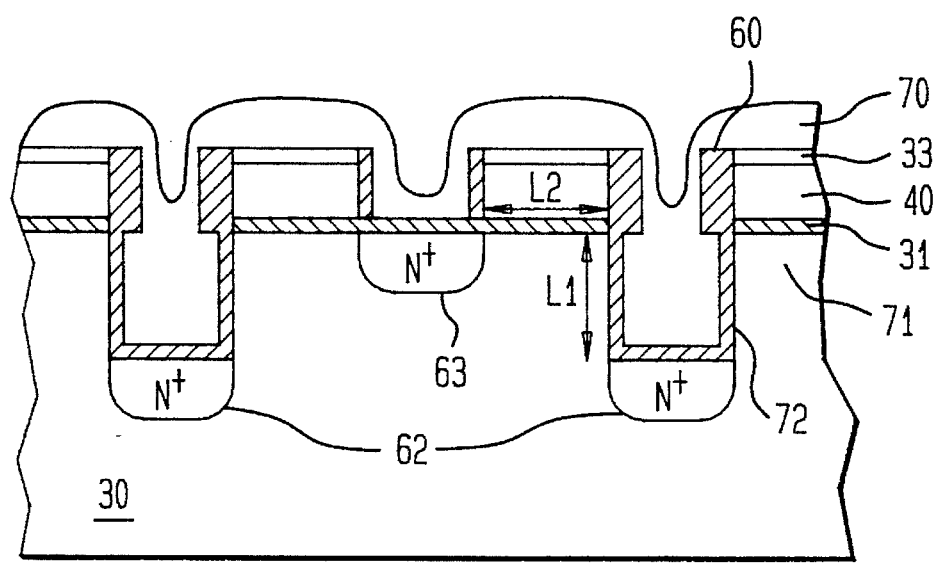

As shown in FIG. 7, a second polysilicon layer 70 is deposited over the structure. This second polysilicon layer is a word line or control gate. The second polysilicon layer 70 is doped and patterned. The floating gate transistor of the cell is designated as 71 and the vertical isolation transistor of the cell is designated as 72. L1 is the channel length of the isolation transistor and L2 is the channel length of the floating gate transistor. The cell is smaller then conventional cells, because the horizontal length is L2 versus L1+L2 of conventional cells.

The isolation transistor of the split-gate Flash cell uses the vertical portion of the trench as its channel area, which saves the cell area. Also, the channel length of the isolation transistor is controlled by the trench depth, which can be better controlled as compared with the alignment method used for conventional split-gate processes.

Finally, the above-described embodiments of the invention are intended to be illustrative only. Numerous alternative embodiments may be devised by those skilled in the art without departing from the spirit and scope of the following claims.

I claim:

1. A split gate memory cell comprising, a substrate of a first dopant type, a first oxide layer grown on a surface of said substrate, a trench formed in said substrate, a source of a second dopant type formed in said trench in said substrate, a drain of said second dopant type formed in said substrate near said surface, a floating gate deposited on said first oxide layer between said source and said drain, a second oxide layer grown on walls of said trench and walls of said floating gate, a dielectric deposited on said floating gate, and a control gate covering said second oxide layer and said dielectric, wherein said drain is separated from said trench by a horizontal channel length of a floating gate transistor, said source is separated from said floating gate by a vertical channel length of a vertical isolation transistor which runs parallel to a side wall of said trench, and wherein a total channel length of said cell is a sum of said horizontal and said vertical channel lengths, said total channel length being consistently controllable.

2. The cell of claim 1, wherein said second oxide layer is thicker on the walls of the floating gate than on the walls of the trench.

3. The cell of claim 1, wherein said first dopant type is P-type and said second dopant type is N+ type.

4. The cell of claim 1, wherein said dielectric is oxide-nitrogen-oxide.

5. The cell of claim 1, wherein said floating gate and said control gate are made of polysilicon materials.

6. The cell of claim 1, wherein said horizontal channel length abuts said vertical channel length and is perpendicular thereto.

7. The cell of claim 1, wherein said second oxide layer is continuous over the walls of said floating gate and over the walls of said trench.

8. The cell of claim 1, wherein said control gate completely fills said trench and is continuous from a surface of said dielectric to a bottom of said trench.

9. The cell of claim 1, wherein said vertical channel length is changed to vary said total channel length without changing the surface area on said substrate occupied by said memory cell.

10. A process for fabricating a split-gate flash memory cell, comprising, growing a first oxide layer on a substrate having a first dopant-type, depositing a polysilicon layer on said first oxide layer, forming a dielectric on said polysilicon layer, patterning polysilicon floating gates out of said polysilicon layer and said first oxide layer using a mask and etch process, forming trenches in said substrate between every other one of said floating gates using a mask and etch process, growing a second oxide layer on side walls of said floating gates and said trenches, implanting ions of a second dopant type in said trenches and between said floating gates so that said implanted ions in said trenches are separated from said first oxide layer by a vertical channel length of a vertical isolation transistor which runs parallel to a side wall of each said trench, and said implanted ions between said floating gates are separated from said trenches by a horizontal channel length, and depositing a wordline over said second oxide layer and said dielectric.

11. The process of claim 10, wherein said step of patterning floating gates comprises, depositing a first layer of photo-resist on said dielectric, and removing portions of said photo-resist layer, said dielectric and said polysilicon layer by a mask and etch process, thereby forming spaces in said polysilicon layer.

12. The process of claim 11, wherein said step of forming trenches in said substrate between every other one of said floating gates comprises, exposing remaining portions of said first layer of photo-resist to ultra-violet light, depositing a second layer of photo-resist over said remaining portions of said first layer of photo-resist and in said spaces, masking and patterning said second layer of photo-resist so that the photo-resist remains in every other one of said spaces in said polysilicon layer, etching said spaces in which no photo-resist remains, thereby forming trenches in every other one of said spaces, and removing said first and second layers of photo-resist.

13. The process of claim 10, wherein said first dopant type is P-type and said second dopant type is N+ type.

14. The process of claim 10, wherein said dielectric is oxygen-nitrogen-oxygen.

15. The process of claim 10, wherein said ion implantation in said trenches forms a source for said cell and said ion implantation between said floating gates, other than in said trenches, forms a drain for said cell.

16. The process of claim 10, wherein both said ion implantations are of arsenic.

17. The process of claim 16, further comprises arsenic ion implantation at approximately 50 kev and a dose unit $5\times10^{15}/cm^2$.

18. The process of claim 10, wherein said second oxide layer is grown to a greater thickness on the side walls of said floating gates than on the side walls of said trenches.

19. A memory cell, comprising a floating gate transistor formed in a substrate having a channel extending horizontally underneath a floating gate, a vertical isolation transistor formed in said substrate having a channel parallel to a trench holding a portion of a polysilicon control gate and orthogonal to the channel of the floating gate transistor, wherein said trench is located at one side of said floating gate, a drain located at an opposite side from said one side of said floating gate so that said drain is separated from said trench by said channel of the floating gate transistor, and a source located in said trench having a width which is substantially equal to a width of said trench.

* * * * *